United States Patent
Kuan et al.

(10) Patent No.: US 10,313,157 B2
(45) Date of Patent: Jun. 4, 2019

(54) APPARATUS AND METHOD FOR MULTIPLEXING MULTI-LANE MULTI-MODE DATA TRANSPORT

(71) Applicant: Realtek Semiconductor Corp., Hsinchu (TW)

(72) Inventors: Chi-Kung Kuan, Taoyuan County (TW); Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 9 days.

(21) Appl. No.: 15/646,147

(22) Filed: Jul. 11, 2017

(65) Prior Publication Data

US 2018/0309597 A1    Oct. 25, 2018

Related U.S. Application Data

(63) Continuation-in-part of application No. 15/496,232, filed on Apr. 25, 2017.

(51) Int. Cl.
*H01L 23/00* (2006.01)
*H04L 12/66* (2006.01)
(Continued)

(52) U.S. Cl.
CPC ............ *H04L 12/66* (2013.01); *G06F 3/0635* (2013.01); *G06F 13/4022* (2013.01);
(Continued)

(58) Field of Classification Search
CPC combination set(s) only.
See application file for complete search history.

(56) References Cited

U.S. PATENT DOCUMENTS 6,614,091 B1 *   9/2003   Downey ................ H01L 24/03
                                                                257/499
6,833,286 B2   12/2004   Fischer et al.
(Continued)

OTHER PUBLICATIONS

TW Office Action dated Apr. 27, 2018 in Taiwan application (No. 106126255).
(Continued)

*Primary Examiner* — Raymond N Phan
(74) *Attorney, Agent, or Firm* — McClure, Qualey & Rodack, LLP

(57) ABSTRACT

An apparatus includes: a semiconductor die including a first I/O (input/output) pad, a second I/O pad, a switch, and an internal processor, wherein the switch is configured to short the first I/O pad to the second I/O pad when a logical signal is asserted; and a semiconductor package including a first bond pad configured to electrically connect to the first I/O pad, a second bond pad configured to electrically connect to the second I/O pad, a first port configured to electrically connect to a pin of a multi-lane, multi-mode connector, a second port configured to electrically connect to an external processor, a first routing path configured to electrically connect the first port to the first bond pad, and a second routing path configured to electrically connect the second port to the second bond pad, wherein the external processor is configured to process an electrical signal at the second port in accordance with a first protocol when the logical signal is asserted, and the internal processor is configured to process an electrical signal at the first I/O pad in accordance with a second protocol when the logical signal is de-asserted.

20 Claims, 2 Drawing Sheets

(51) Int. Cl.
  *G06F 3/06*    (2006.01)
  *G06F 13/40*   (2006.01)
  *H04J 99/00*   (2009.01)
(52) U.S. Cl.
  CPC .............. *H01L 24/06* (2013.01); *H01L 24/09* (2013.01); *H04J 15/00* (2013.01)

(56) References Cited

U.S. PATENT DOCUMENTS

| | | | | |
|---|---|---|---|---|
| 7,196,428 | B2* | 3/2007 | Chen | H01L 24/05 257/786 |
| 7,629,689 | B2* | 12/2009 | Maeda | H01L 22/32 257/758 |
| 8,420,520 | B2* | 4/2013 | Lin | C25D 3/48 257/E21.023 |
| 8,535,976 | B2* | 9/2013 | Lee | H01L 23/49822 438/107 |
| 8,948,081 | B2* | 2/2015 | Sudak | H04W 72/1242 370/321 |
| 9,886,413 | B2* | 2/2018 | Guillerm | G06F 13/4068 |
| 9,929,776 | B2* | 3/2018 | McCormack | H04W 76/10 |
| 2008/0001296 | A1* | 1/2008 | Tu | H01L 23/525 257/762 |
| 2009/0294977 | A1 | 12/2009 | Jao | |
| 2010/0065954 | A1* | 3/2010 | Tu | H01L 24/05 257/686 |
| 2012/0203937 | A1 | 8/2012 | Mohanty et al. | |
| 2016/0049876 | A1 | 2/2016 | Lee et al. | |
| 2017/0103978 | A1 | 4/2017 | Prechtl et al. | |

OTHER PUBLICATIONS

Search Report issued in TW Office Action dated Apr. 27, 2018 in Taiwan application (No. 106126255).
Non-Final Office Action issued in U.S. Appl. No. 15/496,232, filed Apr. 25, 2017, dated Aug. 9, 2018.

* cited by examiner

APPARATUS AND METHOD FOR MULTIPLEXING MULTI-LANE MULTI-MODE DATA TRANSPORT

The present application is a continuation in part of U.S. patent application Ser. No. 15/496,232, filed Apr. 25, 2017, the contents of which are incorporated hereby by reference.

BACKGROUND OF THE INVENTION

Field of the Invention

The present invention generally relates to data transport, and more particularly to an apparatus and method for multiplexing data transport.

Description of Related Art

Data transports are widely used. A protocol is needed in a data transport. Recently, a USB (universal serial bus) type-C connector standard has been adopted. A USB type-C standard compliant connector allows a user to use the same physical pin for transporting data of different protocols. For instance, the same physical pin and the electrical signal thereof used for transporting data in accordance with a USB protocol can also be used for transporting data in accordance with a DisplayPort protocol. For different protocols, however, the corresponding electrical signals need to be processed differently. A multiplexing function is typically used to process the electrical signal in accordance with the protocol that is being used. Besides, a USB type-C connector also supports multi-lane data transport, where a plurality of lanes are used and said lanes might carry electrical signals of different transport protocols.

What are desired are apparatus and methods for multiplexing electrical signals of a pin of a multi-lane, multi-mode connector in accordance with a protocol that is being used for a data transport associated with the electrical signal.

BRIEF SUMMARY OF THIS INVENTION

In an embodiment, an apparatus includes: a semiconductor die including a first I/O (input/output) pad, a second I/O pad, a third I/O pad, a first internal processor configured to process an electrical signal at the first I/O pad in accordance with a first protocol when a first logical signal is de-asserted, a second internal processor configured to process an electrical signal at the second I/O pad in accordance with the first protocol when a second logical signal is de-asserted, a first switch configured to electrically connect the first I/O pad to the third I/O pad when the first logical signal is asserted, and a second switch configured to electrically connect the second I/O pad to the third I/O pad when the second logical signal is asserted; and a semiconductor package including a first bond pad configured to electrically connect to the first I/O pad, a second bond pad configured to electrically connect to the second I/O pad, a third bond pad configured to electrically connect to the third I/O pad, a first port configured to electrically connect to a first pin of a multi-lane, multi-mode connector, a second port configured to electrically connect to a second pin of the multi-lane, multi-mode connector, a third port configured to electrically connect to an external processor configured to process an electrical signal at the third port in accordance with a second protocol, wherein the first port is electrically connected to the first bond pad via a first routing path, the second port is electrically connected to the second bond pad via a second routing path, and the third port is electrically connected to the third bond pad via a third routing path. In an embodiment, the first bond pad electrically connects to the first I/O pad via a first bond wire, the second bond pad electrically connects to the second I/O pad via a second bond wire, and the third bond pad electrically connects to the third I/O pad via a first bond wire. In an embodiment, the first bond wire and the third bond wire are substantially parallel and adjacent to each other. In an embodiment, the second bond wire and the third bond wire are substantially parallel and adjacent to each other. In an embodiment, the semiconductor package is a BGA (ball grid array) package. In an embodiment, the first routing path includes a metal trace. In an embodiment, the first routing path further includes a via. In an embodiment, the second routing path includes a metal trace. In an embodiment, the second routing path further includes a via. In an embodiment, the third routing path includes a via. In an embodiment, the first port electrically connects to the first pin of the multi-lane, multi-mode connector via a first metal trace laid out on a PCB (printed circuit board), while the third port electrically connects to the external processor via a second metal trace laid out on the PCB. In an embodiment, the first metal trace and the second metal trace are laid out on different layers of the PCB.

In an embodiment, a method comprises: electrically connecting a first port, a second port, and a third port of a semiconductor package to a first pin of a multi-lane, multi-mode connector, a second pin of the multi-lane, multi-mode connector, and an external processor, respectively, wherein the external processor is configured to process an electrical signal associated with the third port in accordance with a first protocol; electrically connecting the first port, the second port, and the third port to a first bond pad, a second bond pad, and a third bond pad of the semiconductor package, respectively; electrically connecting the first bond pad, the second bond pad, and the third bond pad to a first I/O pad, a second I/O pad, and a third I/O pad of a semiconductor die, respectively; electrically connecting the first I/O pad with the third I/O pad using a first switch in response to a first logical signal being asserted, else processing an electrical signal at the first I/O pad using a first internal processor in accordance with a second protocol; and electrically connecting the second I/O pad with the third I/O pad using a second switch in response to a second logical signal being asserted, else processing an electrical signal at the second I/O pad using a second internal processor in accordance with the second protocol. In an embodiment, the first port electrically connects to the first bond pad via a first routing path, the second port electrically connects to the second bond pad via a second routing path, and the third port electrically connects to the third bond pad via a third routing path. In an embodiment, the first bond pad electrically connects to the first I/O pad via a first bond wire, the second bond pad electrically connects to the second I/O pad via a second bond wire, and the third bond pad electrically connects to the third I/O pad via a third bond wire. In an embodiment, the first bond wire and the third bond wire are substantially parallel and adjacent to each other. In an embodiment, the second bond wire and the third bond wire are substantially parallel and adjacent to each other. In an embodiment, the semiconductor package is a BGA (ball grid array) package. In an embodiment, the first routing path includes a metal trace. In an embodiment, the first routing path further includes a via. In an embodiment, the second routing path includes a metal trace. In an embodiment, the second routing path further includes a via. In an embodiment, the third routing path includes a via. In an embodiment, the first port electrically connects to the first pin of the multi-lane, multi-mode connector via a first metal trace laid out on a PCB (printed circuit board), while the third port electrically connects to the external processor via a second metal trace laid out on the PCB. In an embodiment, the first metal trace and the second metal trace are laid out on different layers of the PCB.

DETAILED DESCRIPTION OF THIS INVENTION

The present invention relates to data transport. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Persons of ordinary skill in the art understand terms and basic concepts related to microelectronics that are used in this disclosure, such as "electrical signal," "semiconductor die," "semiconductor package," "port," "bond pad," "I/O pad," "bond wire," "switch," "PCB (printed circuit board)," "connector," "data transport," and "protocol." Terms and basic concepts like these are apparent to those of ordinary skill in the art and thus will not be explained in detail here.

A logical signal is a signal of two possible states: "1" and "0." A logical signal is said to be "asserted" when it is in the "1" state, and said to be "de-asserted" when it is in the "0" state.

In this disclosure, a "processor" is an apparatus configured to process an electrical signal to fulfill a function related to data transport. For instance, a processor might be configured to fulfill a transmit function wherein a data stream is converted to the electrical signal in accordance with a certain protocol. On the other hand, a processor might be configured to fulfill a receive function wherein an electrical signal is converted to a data stream in accordance with a certain protocol.

In this disclosure, "A" is said to be electrically connected to "B" if an electrical signal of interest at "A" is effectively transmitted to "B," or vice versa, via an electrical transmission channel that may include one of the following: metal trace, cable, connector, transformer, and AC-coupling capacitor.

Figure 1:
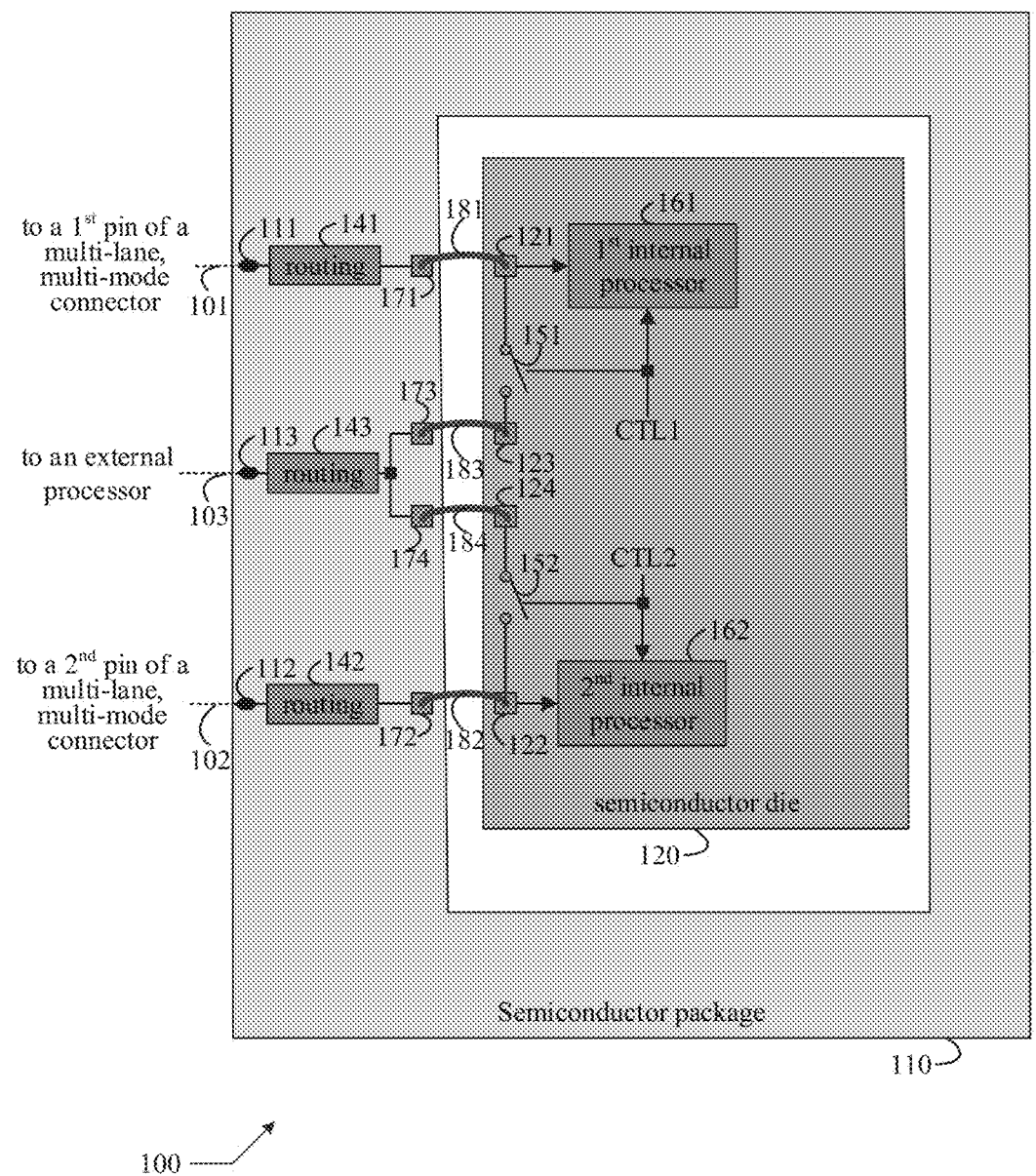
FIG. 1 shows a schematic diagram of an apparatus in accordance with an embodiment of the present invention.

A schematic diagram of an apparatus 100 in accordance with an embodiment of the present invention is depicted in FIG. 1. The apparatus 100 includes a semiconductor die 120 and a semiconductor package 110. The semiconductor die 120 includes a first I/O (input/output) pad 121, a second I/O pad 122, a third I/O pad 123, a fourth I/O pad 124, a first switch 151, a second switch 152, a first internal processor 161, and a second internal processor 162. The first switch 151 and the second switch 152 are controlled by a first logical signal CTL1 and a second logical signal CTL2, respectively. The first (second) switch 151 (152) is configured to short the first (second) I/O pad 121 (122) with the third (fourth) I/O pad 123 (124) when the first (second) logical signal CTL1 (CTL2) is asserted. The first (second) internal processor 161 (162) is controlled by the first (second) logical signal CTL1 (CTL2), and activated when the first (second) logical signal CTL1 (CTL2) is de-asserted.

The semiconductor package 110 comprises a first port 111, a second port 112, a third port 113, a first routing path 141, a second routing path 142, a third routing path 143, a first bond pad 171, a second bond pad 172, a third bond pad 173, and a fourth bond pad 174. The first (second, third) port 111 (112, 113) electrically connects to the first (second, third) bond pad 171 (172, 173) via the first (second, third) routing path 141 (142, 143). The third bond pad 173 and the fourth bond pad 174 are electrically connected. In an embodiment, the apparatus 100 further comprises: a first bond wire 181, a second bond wire 182, a third bond wire 183, and a fourth bond wire 184. The first (second, third, fourth) bond wire 181 (182, 183, 184) is configured to connect the first (second, third, fourth) bond pad 171 (172, 173, 174) to the first (second, third, fourth) I/O pad 121 (122, 123, 124). The first port 111 is electrically connected to a first pin of a multi-lane, multi-mode connector (not shown in figure) as illustrated by a first dash line 101. The second port 112 is electrically connected to a second pin of the multi-lane, multi-mode connector as illustrated by a second dash line 102. The third port 113 is electrically connected to an external processor (not shown in figure) as illustrated by a third dash line 103. The first logical signal CTL1 and the second logical signal can be de-asserted at the same time, but cannot be asserted at the same time.

The apparatus 100 is configured to provide a multiplexing function to support a multi-lane, multi-mode data transport functions via the multi-lane, multi-mode connector. By way of example but not limitation: the multi-lane, multi-mode connector is a USB type-C connector, wherein an electrical signal at the first pin of the multi-lane, multi-mode connector is of either a USB or a DisplayPort protocol, and an electrical signal at the second pin of the multi-lane, multi-mode connector is also of either a USB or a DisplayPort protocol, and the first (second) internal processor 161 (162), when activated, is configured to process an electrical signal at the first (second) I/O pad 121 (122) in accordance with a DisplayPort protocol. The first (second) pin of the multi-lane, multi-mode connector is configured to electrically connect to the first (second) port 111 (112), as illustrated by the first (second) dash line 101 (102), and thus electrically connect to the first (second) I/O pad 121 (122) via a concatenation of the first (second) routing path 141 (142), the first (second) bond pad 171 (172), and the first (second) bond wire 181 (182). When the protocol of the electrical signal at the first (second) pin of the multi-lane, multi-mode connector is USB, the first (second) logical signal CTL1 (CTL2) is asserted; as a result, the first (second) switch 151 (152) is turned on, the first (second) internal processor 161 (162) is de-activated, and the electrical signal at the first (second) pin of the multi-lane, multi-mode connector is effectively routed to the external processor via a concatenation of the first (second) port 111 (112), the first (second) routing path 141 (142), the first (second) bond pad 171 (172), the first (second) bond wire 181 (182), the first (second) I/O pad 121 (122), the first (second) switch 151 (152), the third (fourth) I/O pad 123 (124), the third (fourth) bond wire 183 (184), the third (fourth) bond pad 173 (174), the third routing path 143, and the third port 113. When the protocol of the electrical signal at the first (second) pin of the multi-lane, multi-mode connector is DisplayPort, the first (second) logical signal CTL1 (CTL2) is de-asserted, thus turning off the first (second) switch 151 (152) and activating the first (second) internal processor 161 (162) to process the electrical signal at the first (second) I/O pad 121 (122), and thus effectively process the electrical signal at the first (second) pin of the multi-lane, multi-mode connector via a concatenation of the of the first (second) port 111 (112), the first (second) routing path 141 (142), the first (second) bond pad 171 (172), the first (second) bond wire 181 (182), and the first (second) I/O pad 121 (122). In other words, the apparatus 100 is configured to effectively process the electrical signal at the first (second) pin of the multi-lane, multi-mode connector locally if the protocol is DisplayPort, otherwise relay the electrical signal to the external processor via the third port 113. However, the electrical signal at the first pin of the multi-lane, multi-mode connector and the electrical signal at the second pin of the multi-lane, multi-mode connector cannot be of the USB protocol at the same time, otherwise they will be effectively shorted. This is why the first logical signal CTL1 and the second logical signal CTL2 cannot be asserted at the same time.

In an embodiment, the first (second) bond wire 181 (182) and the third (fourth) bond wire 183 (184) are substantially parallel and adjacent to each other. This arrangement helps to mitigate the overall inductance of the first (second) bond wire 181 (182) and the third (fourth) bond wire 183 (184) when the first (second) logical signal CTL1 (CTL2) is asserted, thanks to an opposite direction of current flow. By way of example but not limitation, the first (second) bond wire 181 (182) and the third (fourth) bond wire 183 (184) are both 2 mm long and parallel to each other but separated by a distance of 0.1 mm.

Note that the third I/O pad 123 is electrically connected to the fourth I/O pad 124 via a concatenation of the third bond wire 183, the third bond pad 173, the fourth bond pad 174, and the fourth bond wire 184. In an embodiment not shown in FIG. 1 but can be easily understood by those of ordinary skill in the art, the fourth bond pad 174, the fourth bond wire 184, and the fourth I/O pad 124 are removed, and the second switch 152 directly connects to the third I/O pad 123, instead of the fourth I/O pad 124.

In an embodiment, the semiconductor package 110 is a BGA (ball grid array) package, wherein the first port 111, the second port 112, and third port 113 are all balls. In an embodiment, the first routing path 141 includes a metal trace. In an embodiment, the first routing path 141 further includes a via. In an embodiment, the second routing path 142 includes a metal trace. In an embodiment, the second routing path 142 further includes a via. In an embodiment, the third routing path 143 includes a via. In an embodiment, the semiconductor package 110 is attached to a PCB (printed circuit board, not explicitly shown in FIG. 1, but implied by the first dash 101, the second dash line 102, and the third dash line 103), wherein the first, the second, and the third port 111, 112, and 113 contacts a first, a second, and a third soldering pad of the PCB, respectively.

In an embodiment, the first soldering pad is configured to electrically connect to the first pin of the multi-lane, multi-mode connector via a first metal trace of the PCB, the second soldering pad is configured to electrically connect to the second pin of the multi-lane, multi-mode connector via a second metal trace of the PCB, while the third soldering pad is configured to electrically connect to the external processor via a third metal trace of the PCB. In an embodiment, the first metal trace and the third metal trace are laid out on two different layers of the PCB. In an embodiment, the second metal trace and the third metal trace are laid out on two different layers of the PCB.

In an alternative embodiment, the semiconductor package 110 is a flip-chip package, wherein the first (second, third, fourth) bond pad 171 (172, 173, 174) is configured to directly contact the first (second, third, fourth) I/O pad 121 (122, 123, 124). In this case, the bond wires (181, 182, 183, and 184) are removed.

In another embodiment, the semiconductor package 110 is a QFP (quad flat package) package.

In a yet another embodiment, the semiconductor package 110 is a QFN (quad flat no-lead) package.

Figure 2:
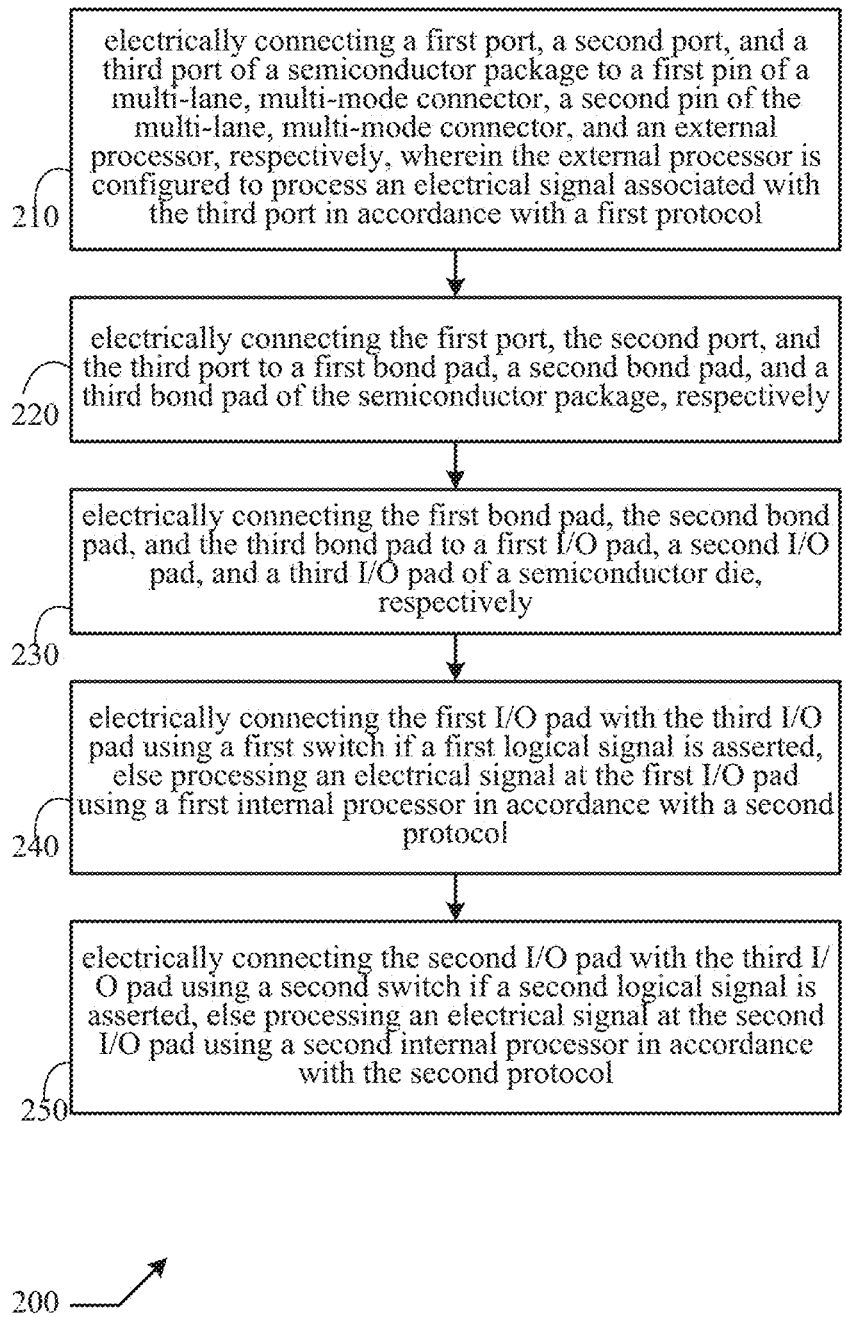
FIG. 2 shows a flow diagram of a method in accordance with an embodiment of the present invention.

In an embodiment illustrated by a flow diagram 200 depicted in FIG. 2, a method comprises: electrically connecting a first port, a second port, and a third port of a semiconductor package to a first pin of a multi-lane, multi-mode connector, a second pin of the multi-lane, multi-mode connector, and an external processor, respectively, wherein the external processor is configured to process an electrical signal associated with the third port in accordance with a first protocol (step 210); electrically connecting the first port, the second port, and the third port to a first bond pad, a second bond pad, and a third bond pad of the semiconductor package, respectively (step 220); electrically connecting the first bond pad, the second bond pad, and the third bond pad to a first I/O pad, a second I/O pad, and a third I/O pad of a semiconductor die, respectively (step 230); electrically connecting the first I/O pad with the third I/O pad using a first switch in response to a first logical signal being asserted, else processing an electrical signal at the first I/O pad using a first internal processor in accordance with a second protocol (step 240); and electrically connecting the second I/O pad with the third I/O pad using a second switch in response to a second logical signal being asserted, else processing an electrical signal at the second I/O pad using a second internal processor in accordance with the second protocol (step 250).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus comprising:
   a semiconductor die including:
   a first I/O (input/output) pad, a second I/O pad, and a third I/O pad;
   a first internal processor configured to process an electrical signal at the first I/O pad in accordance with a first protocol, when a first logical signal is de-asserted,
   a second internal processor configured to process an electrical signal at the second I/O pad in accordance with the first protocol, when a second logical signal is de-asserted,
   a first switch configured to electrically connect the first I/O pad to the third I/O pad, when the first logical signal is asserted, and
   a second switch configured to electrically connect the second I/O pad to the third I/O pad when the second logical signal is asserted; and
   a semiconductor package including:
   a first bond pad configured to electrically connect to the first I/O pad,
   a second bond pad configured to electrically connect to the second I/O pad,
   a third bond pad configured to electrically connect to the third I/O pad, a first port configured to electrically connect to a first pin of a multi-lane, multi-mode connector, a second port configured to electrically connect to a second pin of the multi-lane, multi-mode connector, and a third port configured to electrically connect to an external processor configured to process an electrical signal at the third port in accordance with a second protocol, wherein the first port is electrically connected to the first bond pad via a first routing path, the second port is electrically connected to the second bond pad via a second routing path, and the third port is electrically connected to the third bond pad via a third routing path.

2. The apparatus of claim 1, wherein the first bond pad electrically connects to the first I/O pad via a first bond wire, the second bond pad electrically connects to the second I/O pad via a second bond wire, and the third bond pad electrically connects to the third I/O pad via a first bond wire.

3. The apparatus of claim 1, wherein the semiconductor package is a BGA (ball grid array) package.

4. The apparatus of claim 1, wherein the first port electrically connects to the first pin of the multi-lane, multi-mode connector via a first metal trace laid out on a PCB (printed circuit board), while the third port electrically connects to the external processor via a second metal trace laid out on the PCB.

5. The apparatus of claim 1, wherein the second protocol is a USB (universal serial bus) protocol, while the first protocol is a DisplayPort protocol.

6. The apparatus of claim 2, wherein the first bond wire and the third bond wire are substantially parallel and adjacent to each other.

7. The apparatus of claim 2, wherein the second bond wire and the third bond wire are substantially parallel and adjacent to each other.

8. The apparatus of claim 3, wherein the first routing path includes a metal trace.

9. The apparatus of claim 3, wherein the third routing path includes a via.

10. The apparatus of claim 4, wherein the first metal trace and the second metal trace are laid out on different layers of the PCB.

11. The apparatus of claim 8, wherein the first routing path further includes a via.

12. A method comprising:

electrically connecting a first port, a second port, and a third port of a semiconductor package to a first pin of a multi-lane, multi-mode connector, a second pin of the multi-lane, multi-mode connector, and an external processor, respectively, wherein the external processor is configured to process an electrical signal associated with the third port in accordance with a first protocol;

electrically connecting the first port, the second port, and the third port to a first bond pad, a second bond pad, and a third bond pad of the semiconductor package, respectively;

electrically connecting the first bond pad, the second bond pad, and the third bond pad to a first I/O pad, a second I/O pad, and a third I/O pad of a semiconductor die, respectively;

electrically connecting the first I/O pad with the third I/O pad using a first switch in response to a first logical signal being asserted, else processing an electrical signal at the first I/O pad using a first internal processor in accordance with a second protocol; and electrically connecting the second I/O pad with the third I/O pad using a second switch in response to a second logical signal being asserted, else processing an electrical signal at the second I/O pad using a second internal processor in accordance with the second protocol.

13. The method of claim 12, wherein the first bond pad electrically connects to the first I/O pad via a first bond wire, the second bond pad electrically connects to the second I/O pad via a second bond wire, and the third bond pad electrically connects to the third I/O pad via a third bond wire.

14. The method of claim 12, wherein the semiconductor package is a BGA (ball grid array) package.

15. The method of claim 12, wherein the first port electrically connects to the first pin of the multi-lane, multi-mode connector via a first metal trace laid out on a PCB (printed circuit board), while the third port electrically connects to the external processor via a second metal trace laid out on the PCB.

16. The method of claim 12, wherein the first protocol is a USB (universal serial bus) protocol, while the second protocol is a DisplayPort protocol.

17. The method of claim 13, wherein the first bond wire and third bond wire are substantially parallel and adjacent to each other.

18. The method of claim 13, wherein the second bond wire and third bond wire are substantially parallel and adjacent to each other.

19. The method of claim 14, wherein the first routing path includes a metal trace.

20. The method of claim 15, wherein the first metal trace and the second metal trace are laid out on different layers of the PCB.

* * * * *